United States Patent
Fukiharu

[11] Patent Number: 5,818,145
[45] Date of Patent: *Oct. 6, 1998

[54] SURFACE ACOUSTIC WAVE DEVICE

[75] Inventor: Eiichi Fukiharu, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 629,433

[22] Filed: Apr. 9, 1996

[30] Foreign Application Priority Data

Apr. 10, 1995 [JP] Japan ................................. 7-083039

[51] Int. Cl.⁶ ........................... H03H 9/25; H01L 41/08
[52] U.S. Cl. ........................... 310/313 R; 310/348
[58] Field of Search ........................... 310/313 R, 344, 310/348

[56] References Cited

U.S. PATENT DOCUMENTS

| | | | |
|---|---|---|---|
| 4,295,102 | 10/1981 | Schmidt et al. | 310/313 R |
| 4,736,128 | 4/1988 | Takoshima et al. | 310/313 R |
| 4,990,814 | 2/1991 | Tanski et al. | 310/313 R |
| 5,252,882 | 10/1993 | Yatsuda | 310/313 R |
| 5,281,883 | 1/1994 | Ikata et al. | 310/313 R |
| 5,416,447 | 5/1995 | Andres et al. | 310/313 R |
| 5,459,368 | 10/1995 | Onishi et al. | 310/313 R |

FOREIGN PATENT DOCUMENTS

| | | | |
|---|---|---|---|
| 63-74312 | 4/1988 | Japan | 310/344 |
| 1-213018 | 8/1989 | Japan | 310/313 R |
| 5-335878 | 12/1993 | Japan | 310/313 R |
| 6-140870 | 5/1994 | Japan | 310/313 R |

*Primary Examiner*—Thomas M. Dougherty
*Attorney, Agent, or Firm*—Ostrolenk, Faber, Gerb & Soffen, LLP

[57] ABSTRACT

A surface acoustic wave device of the present invention includes piezo-electric substrates 1 and 2 each having one surface formed with interdigital electrodes 12A, 12B, for transmission and receiving of surface acoustic waves, are received in a casing including a stem 4, a seal ring 9 and a cover plate 5, etc. The piezo-electric substrates 1 and 2 are arranged such that the one surfaces thereof face each other with a predetermined space therebetween and electrically conductive members 3 are disposed between the piezo-electric substrates 1 and 2. The electrically conductive members 3 may be gold bumps, solder bumps, metal balls of such as solder or copper, electrically conductive adhesive members or electrically conductive rubber members, etc. The surface acoustic wave device is applicable to such as filters and featured by having small mounting area and easiness of manufacture.

8 Claims, 4 Drawing Sheets

SURFACE ACOUSTIC WAVE DEVICE

BACKGROUND OF THE INVENTION

The present invention relates to a surface acoustic wave device capable of being mounted on a surface of a substrate and, particularly, to a surface acoustic wave device equipped with a plurality of surface acoustic wave elements.

A surface acoustic wave device which utilizes surface acoustic wave propagating along a surface of a solid material has been used popularly. For example, a surface acoustic wave filter is used in various communication devices such as portable telephone sets and various electronic devices such as television tuners and video tape recorders.

The surface acoustic wave device is basically constructed with a piezo-electric substrate along which surface acoustic wave propagates and interdigital electrodes formed on a surface of the piezo-electric substrate to transmit and receive surface acoustic wave. When a surface acoustic wave device is used in, for example, an electronic device as a filter, the surface acoustic wave device is usually constituted with a plurality of surface acoustic wave filters each including a set of interdigital electrodes for transmission and receiving of surface acoustic wave.

It has been known that the surface acoustic wave device constituted with the plurality of surface acoustic wave elements has a construction having a plurality of surface acoustic wave elements formed on a single piezo-electric substrate or a construction having a pair of piezo-electric substrates each formed on one surface thereof with a single surface acoustic wave element, with the other surfaces of the piezo-electric substrates being bonded together.

In the former construction, a plurality of interdigital electrode sets each constituting a surface acoustic wave element and including interdigital electrodes for transmission and receiving of surface acoustic wave are formed on the single piezo-electric substrate and spaces each between adjacent surface acoustic wave elements are painted with surface acoustic wave absorbing material such as silicon rubber for excluding mutual influence of the elements. In this construction, however, there is a problem that an area of a surface of a circuit board on which the surface acoustic wave device is to be mounted, must be large enough since a plurality of surface acoustic wave elements must be formed in parallel on a single piezo-electric substrate.

On the other hand, in the latter construction, the interdigital electrodes constituting the surface acoustic wave elements are formed on outer surfaces of the bonded piezo-electric substrates. In a filter having this construction, it is necessary, in order to support and electrically connect the bonded piezo-electric substrates, to form a total of 8 relatively thick lead wires for the interdigital electrodes on the outer surfaces of the bonded substrates. Therefore, the manufacturing becomes complex and thus it becomes difficult to make the construction possible to be mounted on a surface of a circuit board.

SUMMARY OF THE INVENTION

An object of the present invention is to provide a surface acoustic wave device having a small mounting area compared with that required conventionally and capable of being manufactured easily.

A surface acoustic wave device according to the present invention comprises a pair of piezo-electric substrates having one surfaces on which interdigital electrodes for transmission and receiving of surface acoustic wave are formed and a casing for receiving the piezo-electric substrates. The piezo-electric substrates are arranged with the one surfaces thereof being faced to each other with a predetermined gap therebetween and an electrically conductive member is disposed in the gap.

It is possible to reduce the mounting area of the surface acoustic wave device according to the present invention since the two piezo-electric substrates are arranged up and down with the one surfaces thereof on which interdigital electrodes are formed being faced to each other. The piezo-electric substrates can be easily connected and fixed to each other by arranging the electrically conductive member between electrode pads formed on the one surfaces thereof. Further, since either of the other surfaces of the piezo-electric substrates on which there is no interdigital electrode formed can be put on a bottom surface of the casing directly, an assembling of the surface acoustic wave device is facilitated. Further, it becomes possible to mount the surface acoustic wave device on a printed circuit board by employing a structure in which the interdigital electrodes on the piezo-electric substrates are electrically connected to electrode terminals formed on a lower surface of the casing.

BRIEF DESCRIPTION OF THE DRAWINGS

The above and other objects, features and advantages of the present invention will become apparent from the following detailed description when taken with the accompanying drawings, in which.

DETAILED DESCRIPTION OF THE PREFERRED EMBODIMENTS

Figure 1:
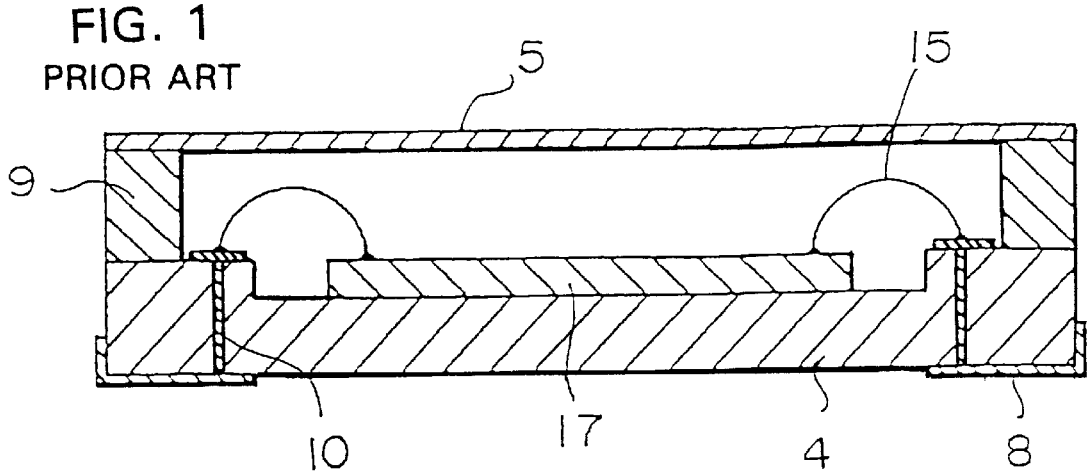
FIG. 1 is a cross section of a conventional surface acoustic wave filter.
Figure 2:
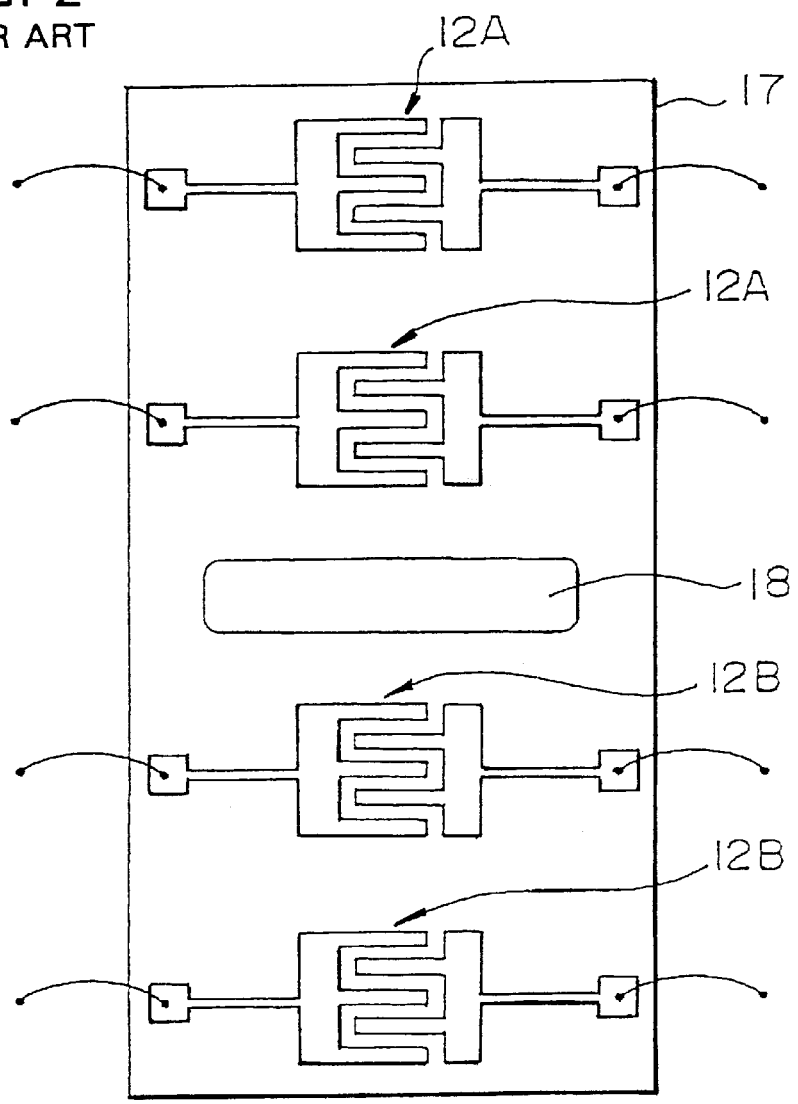
FIG. 2 is a plan view of a piezo-electric substrate of the surface acoustic wave filter shown in FIG. 1.

First, a conventional surface acoustic wave device, particularly, a conventional surface acoustic filter, will be described with reference to FIGS. 1 to 5, in which FIG. 1 is a cross section of an example of the conventional surface acoustic wave filter put on a stem 4 and having a single piezo-electric substrate 17 having two filters formed on one surface thereof and FIG. 2 is a plan view of the piezo-electric substrate 17. On the one surface of the piezo-electric substrate 17, an inter-digital electrode 12A constituting one of the filters and an interdigital electrode 12B constituting another filter and a surface acoustic wave absorbing member 18 are formed. Since this surface acoustic wave filter has the two filters formed in parallel on one surface of the same piezo-electric substrate 17, a mounting area thereof becomes large.

Figure 3:
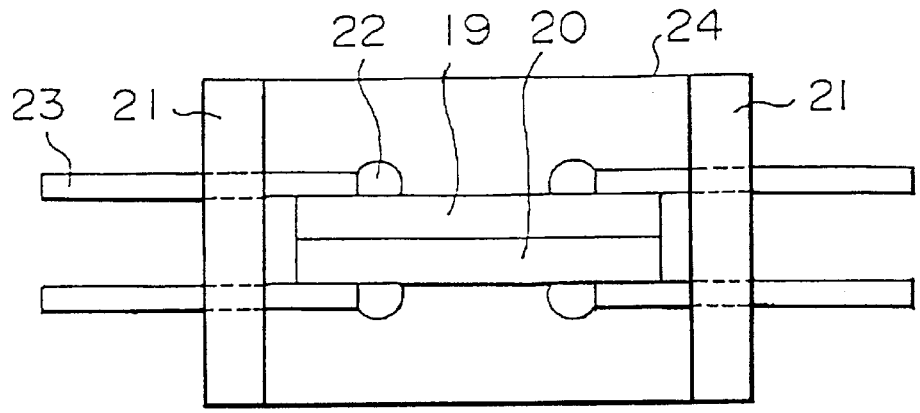
FIG. 3 is a cross section of another conventional surface acoustic wave filter.
Figure 4:
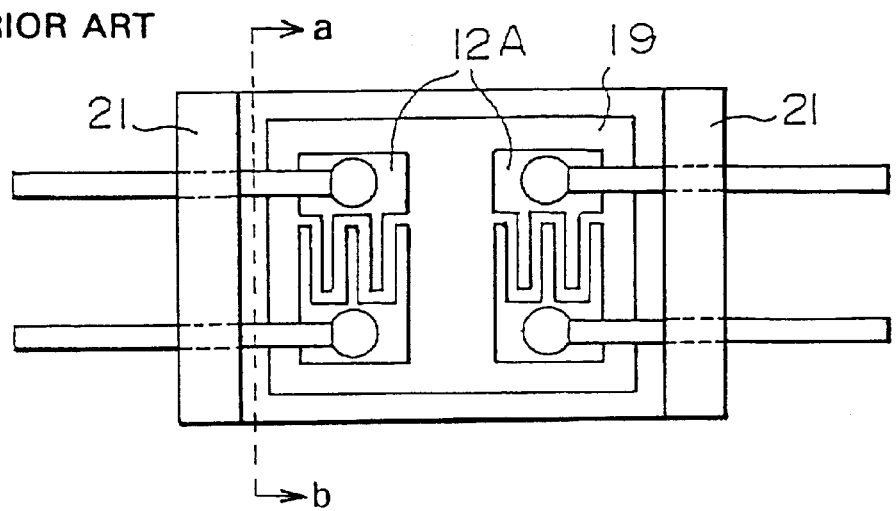
FIG. 4 is a plan view of a piezo-electric substrate of the surface acoustic wave filter shown in FIG. 3.
Figure 5:
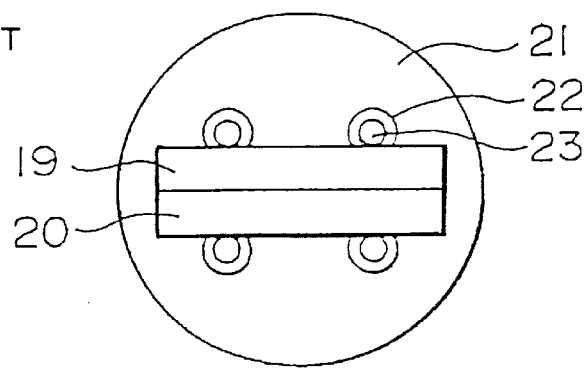
FIG. 5 is a side view of the surface acoustic wave filter shown in FIG. 4 when looked from a line a–b in FIG. 4.

FIGS. 3, 4 and 5 show another example of the conventional surface acoustic wave filter, in which FIG. 3 is a side view showing an interior of a shell 24 thereof. In this surface acoustic wave filter, two piezo-electric substrates 19 and 20 are bonded to each other with one surfaces thereof on which interdigital electrodes are formed being outside. FIG. 4 is a plan view of the surface acoustic wave filter shown in FIG. 3 and FIG. 5 is a side view thereof when looked from a line a–b in FIG. 4. An interdigital electrode 12A constituting a filter is arranged on an upper surface of the bonded piezo-electric substrates 19 and 20 and an inter-digital electrode 12B (not shown) constituting another filter is formed on a lower surface of the bonded substrates. Four lead wires 23 are connected to each of the interdigital electrodes 12A and 12B by means of such as electrically conductive adhesive 22. The lead wires 23 have a function of supporting the piezo-electric substrates 19 and 20 in addition to the function of electrical connection. Therefore, these lead wires 23 are thicker than usual bonding wire and derived out laterally through a stem 21. In the surface acoustic wave filter shown in FIGS. 3 to 5, there is a problem that a manufacturing becomes complex due to the fact that the thick lead wires 23 must be connected to the upper and lower surfaces of the bonded piezo-electric substrates. Further, since the lead wires 23 are derived from side surfaces of the surface acoustic wave filter, it is difficult to mount the filter on a printed circuit board.

Now, an embodiment of a surface acoustic wave device according to the present invention will be described as a surface acoustic wave filter, with reference to FIGS. 6, 7 and 8.

Figure 6:
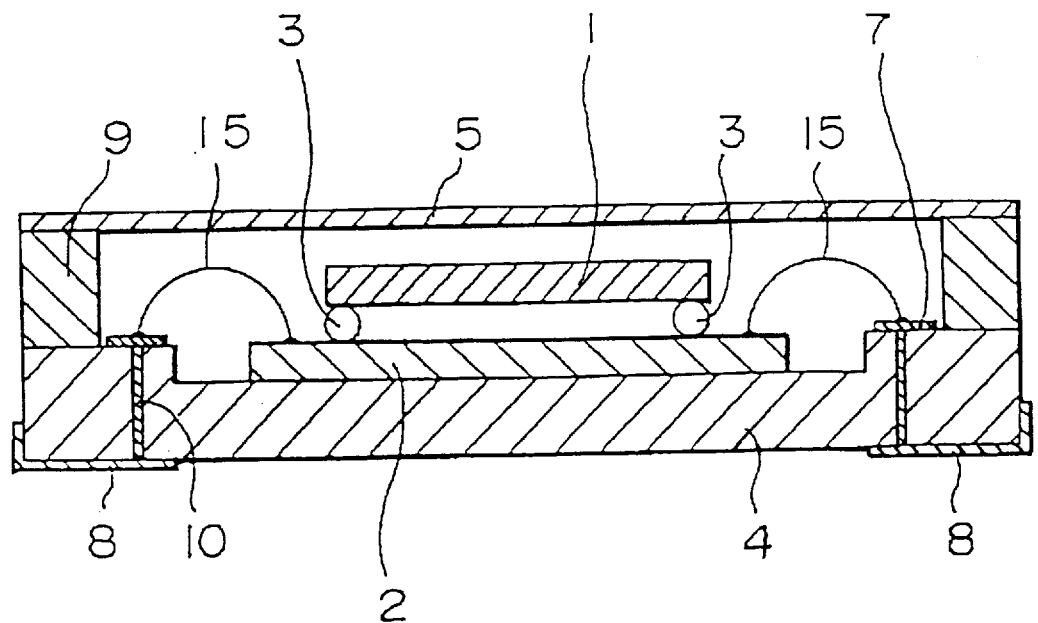
FIG. 6 is a cross section of an embodiment of a surface acoustic wave device according to the present invention.
Figure 7:
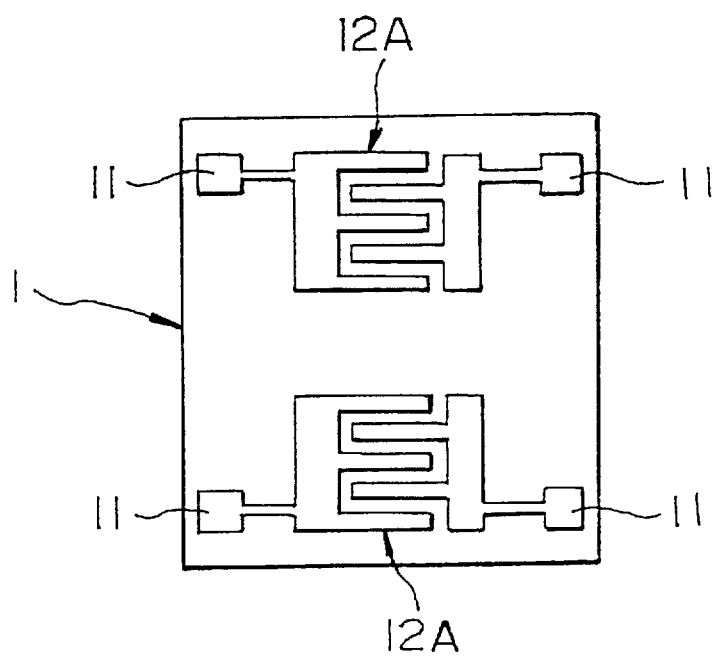
FIG. 7 is a plan view of an upper piezo-electric substrate of the surface acoustic wave device shown in FIG. 6.
Figure 8:
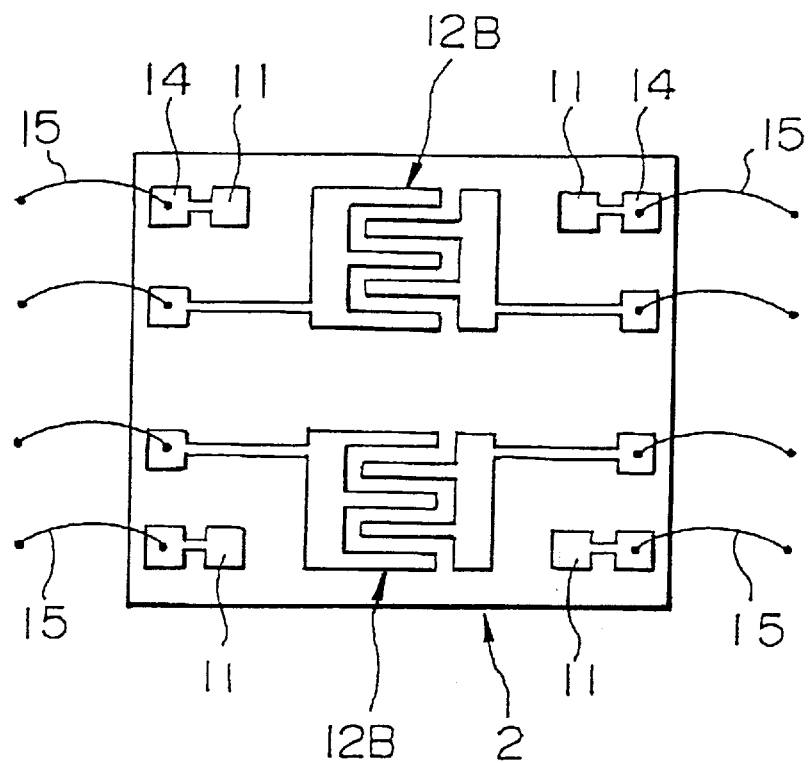
FIG. 8 is a plan view of a lower piezo-electric substrate of the surface acoustic wave device shown in FIG. 6.

FIG. 6 is a cross section of the surface acoustic wave filter of the present invention and FIGS. 7 and 8 are plan views of piezo-electric substrates 1 and 2 of the surface acoustic wave filter shown in FIG. 6, respectively. As shown in FIG. 6, the piezo-electric substrates 1 and 2 are arranged up and down with one surfaces thereof on which interdigital electrodes are formed being faced to each other with a predetermined space. Electrically conductive members 3 are disposed in the space between the substrates.

FIG. 7 shows interdigital electrodes 12A formed on the piezo-electric substrate 1 and electrode pads 11 connected to the respective interdigital electrodes 12A and FIG. 8 shows interdigital electrodes 12B formed on the piezo-electric substrate 2 and bonding pads 14 connected to the respective interdigital electrodes 12B. Four other electrode pads 11 and four other bonding pads 14 connected to the respective other electrode pads 11 are further formed on the piezo-electric substrate 2. The piezo-electric substrates 1 and 2 are arranged up and down with the electrode pads 11 thereon being faced to each other and the electrically conductive members 3 are disposed between the electrode pads 11 of the upper and lower piezo-electric substrates 1 and 2. The conductive members 3 couple the piezo-electric substrates 1 and 2 and electrically connect the interdigital electrodes 12A of the upper piezo-electric substrate 1 to the bonding pads 14 of the lower piezo-electric substrate 2.

The lower piezo-electric substrate 2 is fixed to the stem 4. The 8 bonding pads 14 on the lower piezo-electric substrate 2 which are connected to the respective interdigital electrodes 12A and 12B of the piezo-electric substrates 1 and 2 are connected to bonding pads 7 formed on the stem 4 through bonding wires 15. The bonding pads 7 formed on the stem 4 are connected to electrode terminals 8 formed on a lower surface of the stem 4 through electrically conductive material filling through-holes 10 formed in the stem 4, respectively. That is, the interdigital electrodes 12A and 12B formed on the respective piezo-electric substrates 1 and 2 are connected to the respective electrode terminals 8 on the lower surface of the stem 4.

A seal ring 9 is provided on a periphery of the stem 4 in which the piezo-electric substrates 1 and 2 are arranged and the stem 4 is closed by a cover plate 5 put on the seal ring 9.

A manufacturing method of the surface acoustic wave filter according to the embodiment of the present invention will be described.

The stem 4 is usually formed of ceramics such as alumina. The bonding pads 7, the electrode terminals 8 and the conductors in the through-holes 10 are formed by painting corresponding portions of the stem 4 with electrically conductive paste containing gold, palladium and/or silver, etc., and baking it. It may be possible to paint a green sheet of alumina with the electrically conductive paste, laminating the green sheets and baking them. The bonding pads 7 and the electrode terminals 8 may be plated with a suitable metal material.

The piezo-electric substrates 1 and 2 are of quartz, lithium niobate or lithium tantalate. A plurality of inter-digital electrodes such as the interdigital electrodes 12A, 12B, a plurality of electrode pads such as the electrode pads 11 and a plurality of bonding pads such as the bonding pads 14 are formed on a sheet of the piezo-electric substrate by using metal material such as aluminum or gold and then the substrate sheet is cut to a predetermined size.

Thereafter, the piezo-electric substrate 2 shown in FIG. 8 is fixed to the stem 4 with the one surface of the piezo-electric substrate 2 on which the interdigital electrodes are formed being upside by using adhesive. The bonding pads 14 on the piezo-electric substrate 2 are wire-bonded to the bonding pads 7 on the stem 4 by means of a bonder.

Then, the electrically conductive members 3 are put on the respective electrode pads 11 of the lower piezo-electric substrate 2. Then, the upper piezo-electric substrate 1 is put on the electrically conductive members 3 such that the electrode pads 11 of the upper substrate 1 are put on the respective conductive members 3 and coupled with the lower substrate 2. The electrically conductive members 3 may be gold bumps, gold-nickel bumps obtained by coating nickel bumps with gold or solder bumps. These bumps are preliminarily formed on either or both of the electrode pads 11 to be electrically connected, during a process of forming the interdigital electrodes on the piezo-electric substrates 1 and 2. Solder balls or other metal balls are other examples of the electrically conductive members 3. When such balls are to be used, it is preferable to form solder paste on the electrode pads 11 of at least the lower piezo-electric substrate 2 prior to provision of the balls on the electrode pads 11. In order to bond the electrode pads 11 on one substrate to those on the other substrate by the electrically conductive members 3, the substrates are heat-treated while keeping the space therebetween at the predetermined value, while applying ultrasonic wave thereto if necessary.

An electrically conductive adhesive may be used as the electrically conductive members 3. The electrically conductive adhesive may be epoxy resin or polyamide resin containing silver as a filler. The electrode pads 11 on the piezo-electric substrates are coated with such adhesive by painting or other method and the piezo-electric substrates are bonded together by heat-treatment.

The wire-bonding for bonding the bonding pads 14 and the bonding pads 7 on the stem 4 may be performed after the bonding of the piezo-electric substrates is performed by using the electrically conductive members 3.

After the setting of the piezo-electric substrates 1 and 2 on the stem 4 and the wire-bonding, the seal ring 9 of metal is fixed to the outer periphery of the stem 4 by using adhesive and the cover plate 5 of metal is put on the seal ring 9.

The surface acoustic wave filter of this embodiment has an area of about 3.5 mm×3.5 mm to about 20 mm×10 mm and a thickness of about 1 mm to about 3 mm. In this case, the piezo-electric substrate of the smallest filter has an area of about 1 mm×1 mm and that of the largest filter is about 10 mm×5 mm. The space between the upper and lower piezo-electric substrates 1 and 2 is about 0.1 mm to about 0.3 mm. One side of the electrode pad 11 may be about 0.1 mm to about 0.5 mm.

Figure 9:
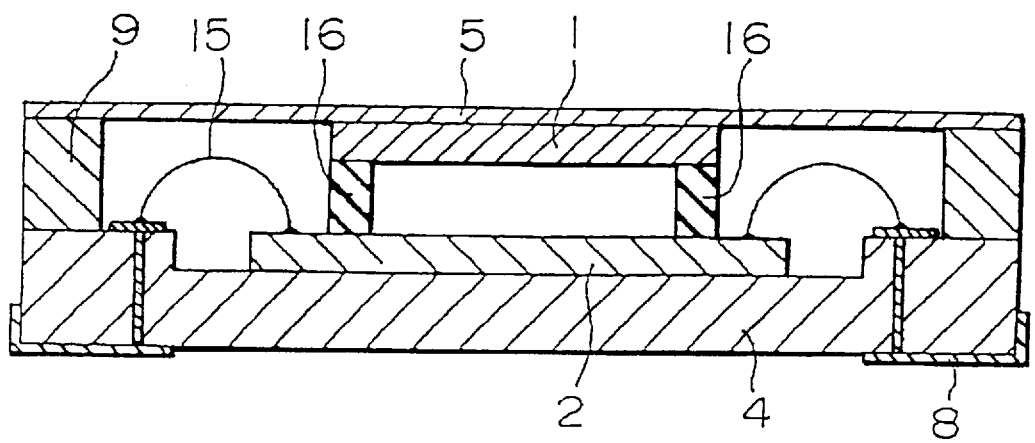
FIG. 9 is a cross section of another embodiment of the surface acoustic wave device according to the present invention.

FIG. 9 is a cross section of another embodiment of the surface acoustic wave device of the present invention in which electrically conductive rubber members 16 are used as the electrically conductive members 3. The electrically conductive rubber members 16 are of such as silicon rubber containing a large amount of carbon black powder or fine particles of metal. The electrically conductive rubber members 16 are put on the electrode pads 11 of the lower piezo-electric substrate 2 and the electrode pads 11 of the upper piezo-electric substrate 1 are put on the electrically conductive rubber members 16. A metal cover plate 5 is put on a metal seal ring 9 such that the metal cover plate 5 presses the piezo-electric substrate 1 down to the piezo-electric substrate 2 to thereby fix the electrically conductive rubber members 16 in place between the piezo-electric substrates.

As described, the surface acoustic wave device according to the present invention includes two piezo-electric substrates arranged up and down with the surfaces thereof on which the interdigital electrodes are formed being faced to each other. Therefore, the mounting area in which the surface acoustic wave device is to be mounted can be minimized and the manufacturing thereof is facilitated. Further, it can be easily mounted on a printed circuit board by connecting the respective interdigital electrodes to the electrode terminals provided on a lower surface of the casing.

It should be noted that the surface acoustic wave device of the present invention can be applied to not only the filter but also other devices such as a resonator, a convolver and a spectrum analyzer. Although not shown, two or more of the surface acoustic wave device of the present invention may be arranged in a single casing.

While the present invention has been described in connection with certain preferred embodiments, it is to be understood that the subject matter encompassed by the present invention is not limited to those specific embodiments. On the contrary, it is intended to include all alternatives, modifications and equivalents as can be included within the spirit and scope of the appended claims.

What is claimed is:

1. A surface acoustic wave device, comprising:
a pair of piezo-electric substrates each having one surface formed with interdigital electrodes and a casing for receiving said piezo-electric substrates, said piezo-electric substrates being arranged with said one surfaces facing each other with a predetermined space therebetween, electrode pads on said piezo-electric substrates, electrically conductive members arranged in said predetermined space between said electrode pads, one of said pair of piezo-electric substrates being smaller and the other being larger in size, said larger piezo-electric substrate having bonding pads disposed on said one surface thereof and at opposite sides of said one surface, and said smaller piezo-electric substrate positioned between said bonding pads at opposite sides of said one surface of said larger piezo-electric substrate.

2. A surface acoustic wave device as claimed in claim 1, wherein said piezo-electric substrates are arranged in said casing so that one is an upper piezo-electric substrate and the other is a lower piezo-electric substrate, and said lower piezo-electric substrate being said larger piezo-electric substrate.

3. A surface acoustic wave device as claimed in claim 1, wherein said electrically conductive members electrically connect electrode pads connected to said interdigital electrodes of one of said piezo-electric substrates to electrode pads of said other piezo-electric substrate.

4. A surface acoustic wave device as claimed in claim 1, wherein said interdigital electrodes formed on said piezo-electric substrates are electrically connected to electrode terminals formed on a surface of said casing.

5. A surface acoustic wave device as claimed in claim 1, wherein said interdigital electrodes formed on said piezo-electric substrates constitute filters.

6. A surface acoustic wave device as claimed in claim 2, wherein said electrically conductive members are metal balls or metal bumps.

7. A surface acoustic wave device as claimed in claim 2, wherein said electrically conductive members are electrically conductive adhesive members or electrically conductive rubber members.

8. A surface acoustic wave device as claimed in claim 2, wherein said electrically conductive members are electrically conductive rubber members, and said casing includes an upper cover plate for receiving said piezo-electric substrates is adapted to press said upper piezo-electric substrate down.

* * * * *